(12) United States Patent
Saigusa et al.

(10) Patent No.: US 7,204,912 B2
(45) Date of Patent: Apr. 17, 2007

(54) METHOD AND APPARATUS FOR AN IMPROVED BELLOWS SHIELD IN A PLASMA PROCESSING SYSTEM

(75) Inventors: Hidehito Saigusa, Nirasaki (JP); Taira Takase, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/259,306

(22) Filed: Sep. 30, 2002

(65) Prior Publication Data

US 2004/0060656 A1    Apr. 1, 2004

(51) Int. Cl.
*H01L 21/00* (2006.01)
*C23C 16/00* (2006.01)

(52) U.S. Cl. .............. 156/345.51; 118/728; 118/720; 427/534; 156/345.3

(58) Field of Classification Search ............... 118/728, 118/720; 156/345.51, 345.3; 427/534
See application file for complete search history.

(56) References Cited

U.S. PATENT DOCUMENTS

| 4,310,390 A | 1/1982 | Bradley et al. |
| 4,357,387 A | 11/1982 | George et al. ............... 442/71 |
| 4,469,619 A | 9/1984 | Ohno et al. |
| 4,593,007 A * | 6/1986 | Novinski .................... 501/105 |
| 4,612,077 A | 9/1986 | Tracy et al. |
| 4,649,858 A | 3/1987 | Sakai et al. |
| 4,842,683 A | 6/1989 | Cheng et al. |
| 4,877,757 A | 10/1989 | York et al. |
| 5,000,113 A | 3/1991 | Wang et al. |
| 5,074,456 A | 12/1991 | Degner et al. |
| 5,334,462 A | 8/1994 | Vine et al. |
| 5,362,335 A | 11/1994 | Rungta |
| 5,366,585 A | 11/1994 | Robertson et al. |
| 5,367,838 A | 11/1994 | Visaisouk et al. |
| 5,423,936 A | 6/1995 | Tomita et al. |
| 5,426,310 A | 6/1995 | Tamada et al. |
| 5,484,752 A | 1/1996 | Waku et al. |
| 5,494,713 A | 2/1996 | Ootuki |
| 5,521,790 A | 5/1996 | Ruckel et al. ............... 361/234 |
| 5,551,190 A | 9/1996 | Yamagishi et al. |
| 5,556,501 A | 9/1996 | Collins et al. |

(Continued)

FOREIGN PATENT DOCUMENTS

DE          94 21 671          7/1996

(Continued)

OTHER PUBLICATIONS

JIS Using Series, "Spraying Techniques Manual.", p. 95 (Oct. 30, 1998, Japanese Standard Association), with English Translation.

(Continued)

*Primary Examiner*—Ram N. Kackar
(74) *Attorney, Agent, or Firm*—Oblon, Spivak, McClelland, Maier & Neustadt, P.C.

(57) ABSTRACT

The present invention presents an improved bellows shield for a plasma processing system, wherein the design and fabrication of the bellows shield coupled to a substrate holder electrode advantageously provides protection of a bellows with substantially minimal erosion of the bellows shield.

30 Claims, 8 Drawing Sheets

U.S. PATENT DOCUMENTS

| | | | |
|---|---|---|---|
| 5,614,055 A | 3/1997 | Fairbairn et al. | |
| 5,637,237 A | 6/1997 | Oehrlein et al. | |
| 5,641,375 A | 6/1997 | Nitescu et al. | |
| 5,651,723 A | 7/1997 | Bjornard et al. | |
| 5,680,013 A | 10/1997 | Dornfest et al. | |
| 5,725,960 A | 3/1998 | Konishi et al. | |
| 5,759,360 A | 6/1998 | Ngan et al. | |
| 5,798,016 A | 8/1998 | Oehrlein et al. | |
| 5,834,070 A | 11/1998 | Movchan et al. | |
| 5,851,343 A | 12/1998 | Hsu et al. | |
| 5,868,848 A | 2/1999 | Tsukamoto | |
| 5,879,575 A | 3/1999 | Tepman et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,892,278 A | 4/1999 | Horita | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,911,852 A | 6/1999 | Katayama et al. | |
| 5,919,332 A | 7/1999 | Koshiishi et al. | |
| 5,925,228 A | 7/1999 | Panitz et al. | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A | 9/1999 | Ravi | |
| 5,955,182 A | 9/1999 | Yasuda et al. | |
| 5,968,377 A | 10/1999 | Yuasa et al. | |
| 5,985,102 A * | 11/1999 | Leiphart | 204/192.12 |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,096,161 A | 8/2000 | Kim et al. | |
| 6,106,625 A | 8/2000 | Koai et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A | 9/2000 | Han et al. | |
| 6,123,804 A | 9/2000 | Babassi et al. | |
| 6,129,808 A * | 10/2000 | Wicker et al. | 156/345.1 |
| 6,139,983 A | 10/2000 | Ohashi et al. | |
| 6,143,646 A | 11/2000 | Wetzel | |
| 6,170,429 B1 | 1/2001 | Schoepp et al. | |
| 6,176,969 B1 | 1/2001 | Park et al. | |
| 6,182,603 B1 | 2/2001 | Shang et al. | |
| 6,210,486 B1 * | 4/2001 | Mizukami et al. | 118/728 |
| 6,221,202 B1 | 4/2001 | Walko, II | |
| 6,246,479 B1 | 6/2001 | Jung et al. | |
| 6,264,788 B1 * | 7/2001 | Tomoyasu et al. | 156/345.43 |
| 6,265,757 B1 | 7/2001 | Brady et al. | |
| 6,266,133 B1 | 7/2001 | Miyajima et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 | 5/2002 | Nakahara et al. | |
| 6,394,026 B1 | 5/2002 | Wicker et al. | |
| 6,413,578 B1 | 7/2002 | Stowell et al. | |
| 6,444,083 B1 | 9/2002 | Steger et al. | |
| 6,514,377 B1 | 2/2003 | Morimoto | |
| 6,519,037 B2 | 2/2003 | Jung et al. | |
| 6,527,911 B1 | 3/2003 | Yen et al. | |
| 6,533,910 B2 | 3/2003 | O'Donnell et al. | |
| 6,537,429 B2 | 3/2003 | O'Donnell et al. | |
| 6,544,380 B2 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B2 | 5/2003 | Jung et al. | |
| 6,583,064 B2 | 6/2003 | Wicker et al. | |
| 6,590,660 B2 | 7/2003 | Jung et al. | |
| 6,613,204 B2 | 9/2003 | Xie et al. | |
| 6,613,442 B2 | 9/2003 | O'Donnell et al. | |
| 6,641,697 B2 | 11/2003 | Han et al. | |
| 6,663,714 B2 | 12/2003 | Mizuno et al. | |
| 6,695,929 B2 | 2/2004 | Kanekiyo et al. | |
| 6,726,801 B2 | 4/2004 | Ahn | |
| 6,733,620 B1 | 5/2004 | Sugiyama et al. | |
| 6,738,862 B1 | 5/2004 | Ross et al. | |
| 6,776,873 B1 | 8/2004 | Sun et al. | |
| 6,783,863 B2 | 8/2004 | Harada et al. | |
| 6,783,875 B2 | 8/2004 | Yamada et al. | |
| 6,798,519 B2 | 9/2004 | Nishimoto et al. | |
| 6,805,952 B2 | 10/2004 | Chang et al. | |
| 6,806,949 B2 | 10/2004 | Ludviksson et al. | |
| 6,811,651 B2 | 11/2004 | Long | |
| 6,830,622 B2 | 12/2004 | O'Donnell et al. | |
| 6,833,279 B2 | 12/2004 | Choi | |
| 6,837,966 B2 | 1/2005 | Nishimoto et al. | |
| 6,852,433 B2 | 2/2005 | Maeda | |
| 6,863,594 B2 | 3/2005 | Preising | |
| 6,875,477 B2 | 4/2005 | Trickett et al. | |
| 6,884,516 B2 | 4/2005 | Harada et al. | |
| 6,894,769 B2 | 5/2005 | Ludviksson et al. | |
| 6,896,785 B2 | 5/2005 | Shatrov et al. | |
| 2001/0003271 A1 | 6/2001 | Otsuki | |
| 2001/0050144 A1 | 12/2001 | Nishikawa et al. | |
| 2002/0076508 A1 | 6/2002 | Chiang et al. | |
| 2002/0086118 A1 * | 7/2002 | Chang et al. | 427/447 |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010446 A1 | 1/2003 | Kajiyama et al. | |
| 2003/0029563 A1 * | 2/2003 | Kaushal et al. | 156/345.1 |
| 2003/0084848 A1 | 5/2003 | Long | |
| 2003/0113479 A1 | 6/2003 | Fakuda et al. | 427/569 |
| 2003/0150419 A1 | 8/2003 | Daragheh et al. | |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0060779 A1 | 4/2004 | Kreger | |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0081746 A1 | 4/2004 | Imafuku | |
| 2004/0083970 A1 | 5/2004 | Imafuku et al. | |
| 2004/0125359 A1 | 7/2004 | Ludviksson et al. | |
| 2004/0168640 A1 | 9/2004 | Muto et al. | |
| 2004/0173155 A1 | 9/2004 | Nishimoto et al. | |
| 2004/0216667 A1 | 11/2004 | Mitsuhashi et al. | |
| 2005/0103268 A1 | 5/2005 | Nishimoto et al. | |
| 2005/0103275 A1 | 5/2005 | Sasaki et al. | |
| 2005/0150866 A1 | 7/2005 | O'Donnell | 216/67 |
| 2006/0134919 A1 | 6/2006 | Hamelin et al. | |

FOREIGN PATENT DOCUMENTS

| | | |
|---|---|---|
| EP | 0 508 731 | 10/1992 |
| EP | 0 508 731 A2 | 10/1992 |
| EP | 0 573 057 | 12/1993 |
| EP | 0 814 495 | 6/1997 |
| EP | 0 799 904 | 10/1997 |
| EP | 0 814 495 | 12/1997 |

| | | | | | | |
|---|---|---|---|---|---|---|
| EP | 0 841 838 | 5/1998 | | JP | 11-080925 | 3/1999 |
| EP | 1 069 603 | 1/2001 | | JP | 11-207161 | 8/1999 |
| EP | 1 081 749 | 7/2001 | | JP | 11-233292 | 8/1999 |
| EP | 1 081 749 A1 | 7/2001 | | JP | 11-312646 | 11/1999 |
| EP | 1 156 130 | 11/2001 | | JP | 2000-124197 | 4/2000 |
| GB | 2 252 567 | 8/1992 | | JP | 2000-303180 | 10/2000 |
| JP | 61-207566 | 9/1986 | | JP | 2001-031484 | 2/2001 |
| JP | 64-039728 | 2/1989 | | JP | 2001-152307 | 6/2001 |
| JP | 01-312087 | 12/1989 | | JP | 2001-164354 | 6/2001 |
| JP | 1-312087 | 12/1989 | | JP | 2001-226773 | 8/2001 |
| JP | 02-267967 | 11/1990 | | JP | 2002-151473 | 5/2002 |
| JP | 03-115535 | 5/1991 | | KR | 1998-063542 | 10/1998 |
| JP | 4-238882 | 8/1992 | | KR | 1999-008142 | 1/1999 |
| JP | 04-238882 | 8/1992 | | KR | 2002-0027373 | 4/2002 |
| JP | 05-070922 | 3/1993 | | KR | 10/2004-0007601 | 1/2004 |
| JP | 05-117064 | 5/1993 | | WO | 99/50886 | 10/1999 |
| JP | 05-121360 | 5/1993 | | WO | WO 99/50886 | 10/1999 |
| JP | 05121360 A * | 5/1993 | | WO | 01/42526 | 6/2001 |
| JP | 05-198532 | 8/1993 | | WO | WO 01/42526 | 6/2001 |
| JP | 05-238859 | 9/1993 | | WO | 02/39495 | 5/2002 |
| JP | 06-057396 | 3/1994 | | WO | WO 02/39495 | 5/2002 |
| JP | 60-057396 | 3/1994 | | WO | 02/48421 | 6/2002 |
| JP | 06-136505 | 5/1994 | | WO | WO 02/48421 | 6/2002 |
| JP | 06-142822 | 5/1994 | | WO | WO 2004/030011 | 4/2004 |
| JP | 60-136505 | 5/1994 | | WO | WO 2004/030012 | 4/2004 |
| JP | 60-142822 | 5/1994 | | WO | WO 2004/030013 | 4/2004 |
| JP | 06-256926 | 9/1994 | | WO | WO 2004/030014 | 4/2004 |
| JP | 07-058013 A | 3/1995 | | WO | WO 2004/030015 | 4/2004 |
| JP | 07-126827 | 5/1995 | | WO | WO 2004/030020 | 4/2004 |
| JP | 07-176524 | 7/1995 | | WO | WO 2004/030426 | 4/2004 |
| JP | 07-226378 | 8/1995 | | WO | WO 2004/095530 | 11/2004 |
| JP | 07-245295 | 9/1995 | | WO | WO 2004/095532 | 11/2004 |
| JP | 08-037180 | 2/1996 | | | | |
| JP | 08-041309 | 2/1996 | | | | |

OTHER PUBLICATIONS

Production drawing for Deposition Shield, Upper believed to be sold in the U.S. on Apr. 12, 2000.

Production drawing for Deposition Shield believed to be sold in the U.S.prior to Sep. 30, 2001.

Production drawing for Upper Electrode believed to be sold in the U.S. prior to Sep. 30, 2001.

Kim, Hee Jee, "Plasma-Sprayed Alumina-Yttria Ceramic Coatings for Cavitation-Erosion Protection," Sep. 1989, pp. 139-146.

| JP | 08-081777 | 3/1996 |
| JP | 08-268751 | 10/1996 |
| JP | 08-339895 | 12/1996 |
| JP | 09-069554 | 3/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-251871 | 9/1998 |

* cited by examiner

METHOD AND APPARATUS FOR AN IMPROVED BELLOWS SHIELD IN A PLASMA PROCESSING SYSTEM

CROSS-REFERENCE TO RELATED APPLICATIONS

This application is related to U.S. patent application Ser. No. 10/259,858, entitled "Method and apparatus for an improved upper electrode plate with deposition shield in a plasma processing system", filed on even date herewith; U.S. patent application Ser. No. 10/259,382, entitled "Method and apparatus for an improved baffle plate in a plasma processing system", filed on even date herewith; U.S. patent application Ser. No. 10/259,380, entitled "Method and apparatus for an improved baffle plate in a plasma processing system", filed on even date herewith; U.S. patent application Ser. No. 10/259,353, entitled "Method and apparatus for an improved deposition shield in a plasma processing system", filed on even date herewith; U.S. patent application Ser. No. 10/259,352, entitled "Method and apparatus for an improved optical window deposition shield in a plasma processing system", filed on even date herewith; and U.S. patent application Ser. No. 10/259,757, entitled "Method and apparatus for an improved upper electrode plate in a plasma processing system", filed on even date herewith. The entire contents of all of those applications are herein incorporated by reference in their entirety.

FIELD OF THE INVENTION

The present invention relates to an improved component for a plasma processing system and, more particularly, to a bellows shield employed in a plasma processing system to protect a bellows.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved bellows shield for a plasma processing system, wherein the design and fabrication of the bellows shield advantageously addresses the above-identified shortcomings.

It is an object of the present invention to provide a bellows shield that can be coupled to a substrate holder of the plasma processing system. The plasma processing system comprises a cylindrical wall having an inner surface, an outer surface, a first end, and a second end. The first end of the cylindrical wall can comprise an attachment flange, wherein the attachment flange comprises an interior surface coupled to the inner surface of the cylindrical wall and configured to mate with the substrate holder, an inner radial surface, and an exterior surface coupled to the outer surface of the cylindrical wall. The second end of the cylindrical wall can comprise an end surface.

The attachment flange of the bellows shield can further include a plurality of fastening receptors for receiving fastening devices in order to attach the bellows shield to the substrate holder. Each fastening receptor can comprise an entrant cavity, an exit through-hole, and an inner receptor surface.

The bellows shield can further comprise a protective barrier formed on a plurality of exposed surfaces of the bellows shield facing the processing plasma.

It is a further object of the present invention that the plurality of exposed surfaces of the bellows shield comprises the end surface of the cylindrical wall, the outer surface of the cylindrical wall, and the exterior surface of the attachment flange contiguous with the outer surface of the cylindrical wall.

The present invention provides a method of producing a bellows shield in the plasma processing system comprising the steps: fabricating the bellows shield; anodizing the bellows shield to form a surface anodization layer on the bellows shield; machining the exposed surfaces on the bellows shield to remove the surface anodization layer; and forming a protective barrier on the exposed surfaces.

The present invention may optionally include machining of other parts not actually exposed to the plasma. Such parts may be machined in order to provide a contact free from the anodization layer (e.g., in order to provide a better mechanical or electrical contact). Such parts may include, but are not limited to, an interior surface of the attachment flange and an inner receptor surface of the plurality of fastening receptors.

The present invention provides another method of producing the bellows shield in the plasma processing system comprising the steps: fabricating the bellows shield; masking the exposed surfaces on the bellows shield to prevent formation of a surface anodization layer; anodizing the bellows shield to form the surface anodization layer on the bellows shield; and forming a protective barrier on the exposed surfaces.

The present invention may optionally include masking of other parts not actually exposed to the plasma. Such parts may be masked in order to provide a contact free from the anodization layer (e.g., in order to provide a better mechanical or electrical contact). Such parts may include, but are not limited to, an interior surface of the attachment flange and an inner receptor surface of the plurality of fastening receptors.

The present invention also provides a combined method of machining and masking to provide bare exposed surfaces on which to form the protective barrier.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
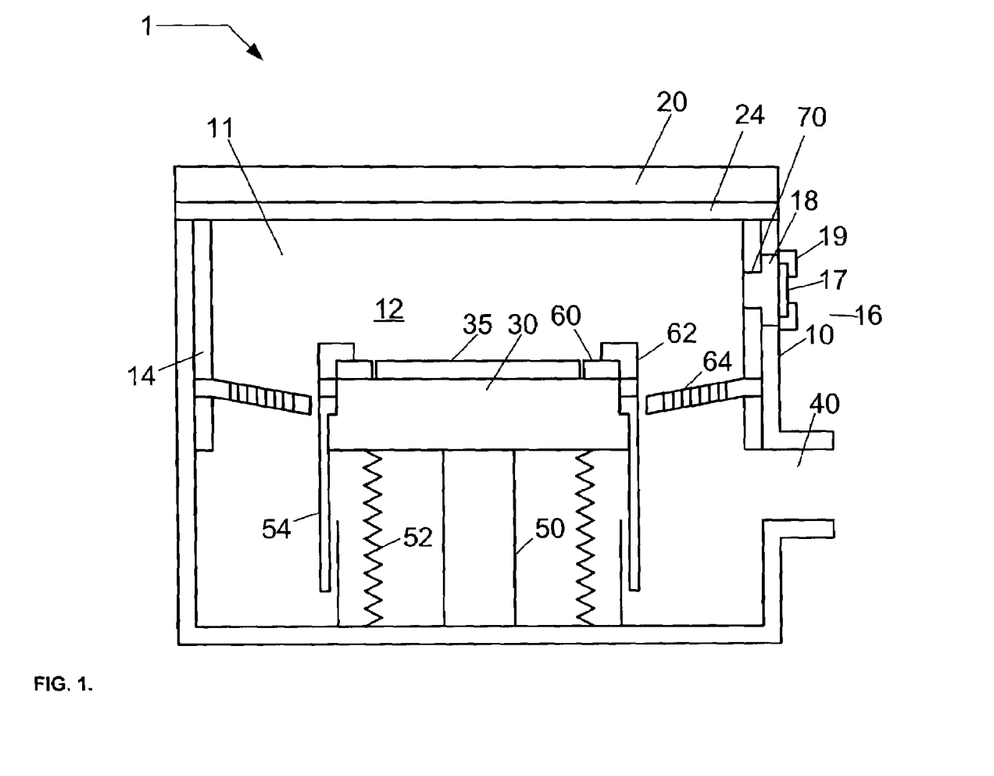
FIG. 1 shows a simplified block diagram of a plasma processing system comprising a bellows shield according to an embodiment of the present invention.

According to an embodiment of the present invention, a plasma processing system 1 is depicted in FIG. 1 comprising a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process substrates of various sizes (e.g., 200 mm substrates, 300 mm substrates, or larger).

In the illustrated embodiment, upper assembly 20 can comprise at least one of a cover, a gas injection assembly, and an upper electrode impedance match network. For example, the electrode plate 24 can be coupled to an RF source. In another alternate embodiment, the upper assembly 20 comprises a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential.

Plasma processing chamber 10 can, for example, further comprise a deposition shield 14 for protecting the plasma processing chamber 10 from the processing plasma in the process space 12, and an optical viewport 16. Optical viewport 16 can comprise an optical window 17 coupled to the backside of an optical window deposition shield 18, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
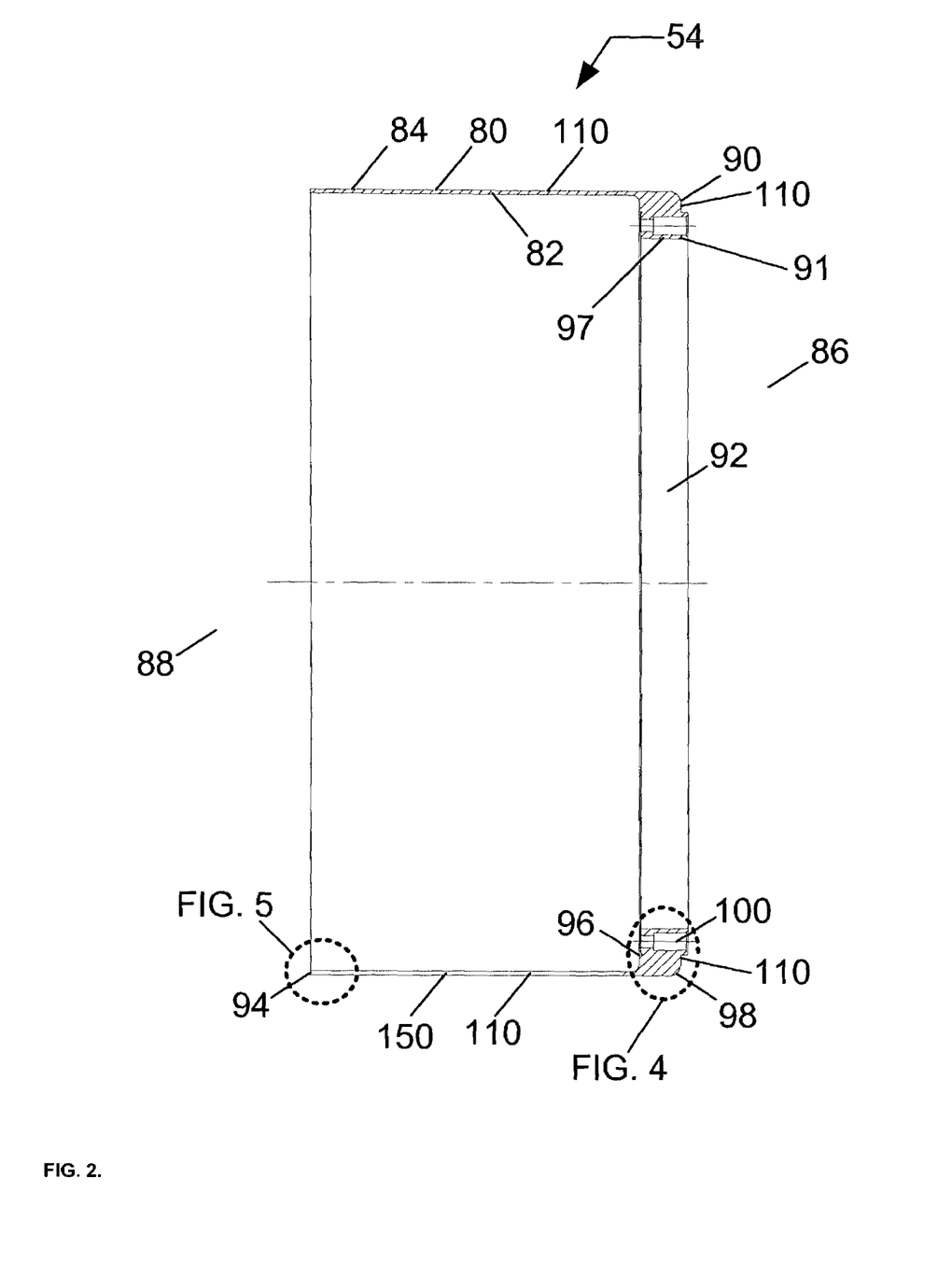
FIG. 2 shows a cross-sectional view of a bellows shield for a plasma processing system according to an embodiment of the present invention.
Figure 3:
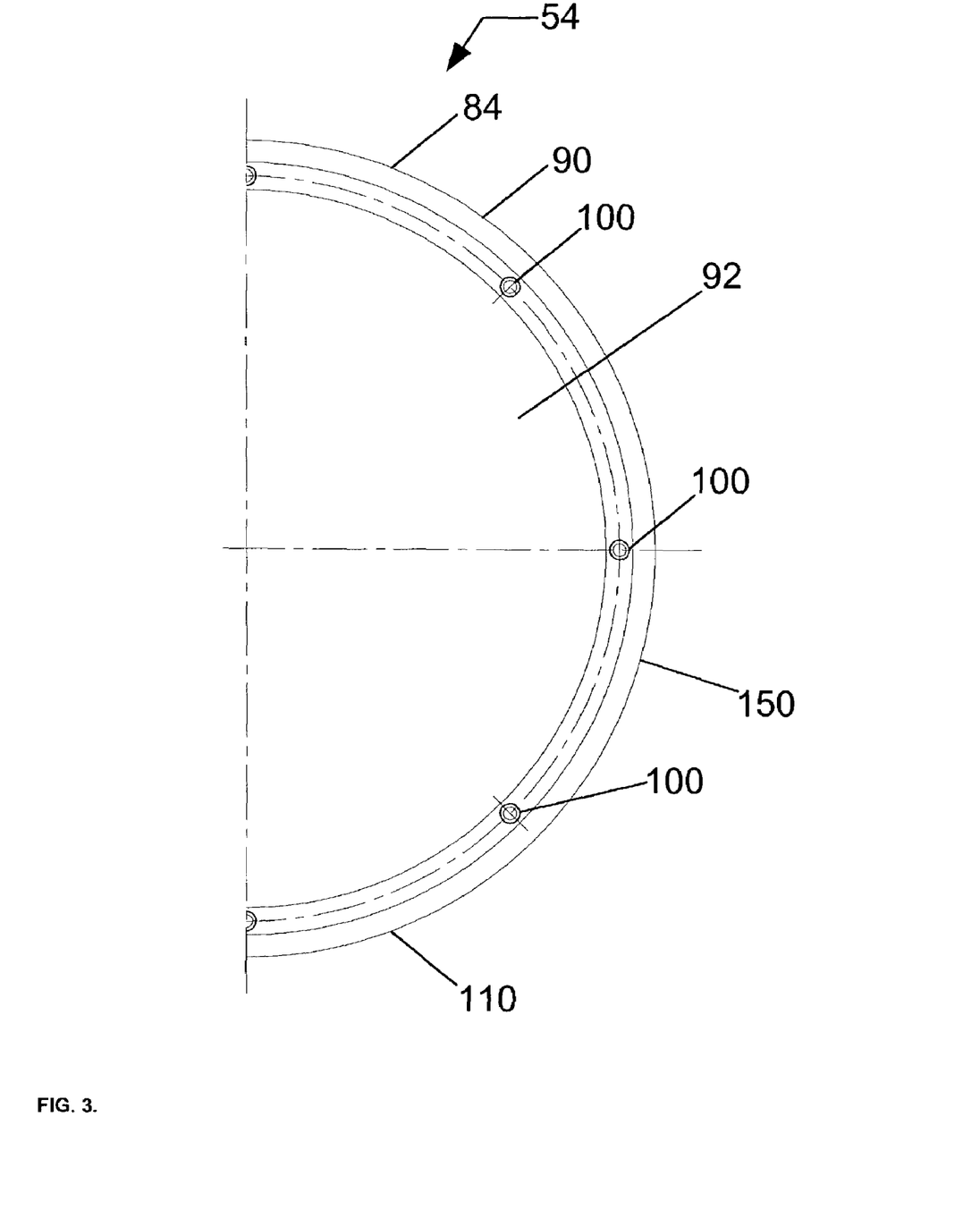
FIG. 3 shows a partial plan view of a bellows shield for the plasma processing system according to an embodiment of the present invention.

Referring now to an illustrated embodiment of the present invention depicted in FIG. 2 (cross-sectional view) and FIG. 3 (partial plan view), bellows shield 54 comprises a cylindrical wall 80, the cylindrical wall 80 comprising an inner surface 82, an outer surface 84, a first end 86, and a second end 88. The first end 86 of cylindrical wall 80 comprises an attachment flange 90 coupled to the cylindrical wall 80 and configured to attach the bellows shield 54 to the substrate holder 30, and a through-hole 92 to accommodate an upper surface of the substrate holder 30. The second end 88 of the cylindrical wall 80 comprises an end surface 94.

Figure 4:
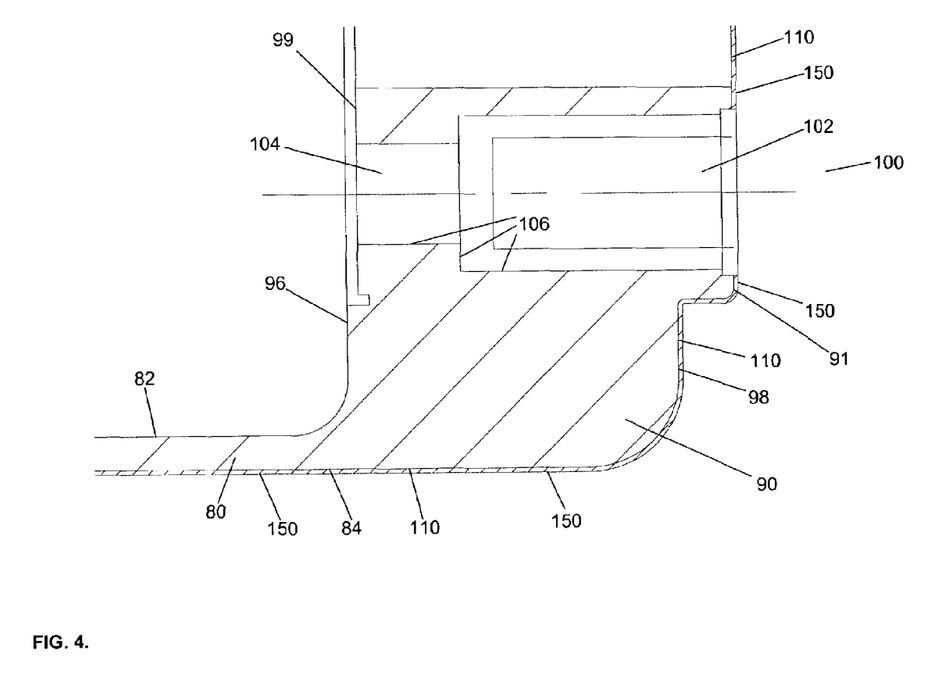
FIG. 4 shows an exploded view of an attachment flange of the bellows shield for the plasma processing system according to an embodiment of the present invention.

FIG. 4 provides an expanded view of the attachment flange 90 coupled to cylindrical wall 80 and configured to couple the bellows shield 54 to the substrate holder 30. The attachment flange 90 comprises an interior surface 96, an inner radial surface 97, and an exterior surface 98. Additionally, the interior surface 96 can comprise a mating surface 99 and the exterior surface can comprise a mounting surface 91 that are configured to couple the bellows shield 54 to the substrate holder 30.

Furthermore, attachment flange 90 can, for example, comprise a plurality of fastening receptors 100, each fastening receptor 100 coupled to the interior surface 96 and the exterior surface 98, and configured to receive fastening devices (not shown) (such as bolts) to couple bellows shield 54 to substrate holder 30. The fastening receptors 100 can comprise an entrant cavity 102, an exit through-hole 104, and an inner receptor surface 106. For example, the number of fastening receptors 100 formed within bellows shield 54 can range from 0 to 100. Desirably, the number of fastening receptors 100 can range from 5 to 20; and, preferably, the number of fastening receptors 100 is at least 6.

Figure 5:
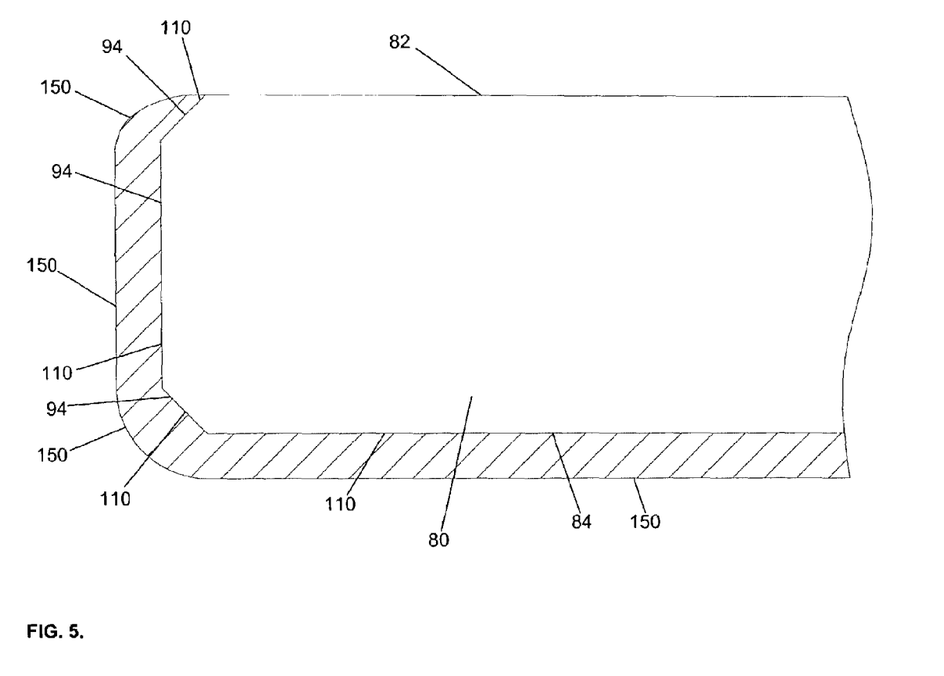
FIG. 5 shows an exploded view of an end surface on a second end of the bellows shield for the plasma processing system according to an embodiment of the present invention.

FIG. 5 provides an expanded view of the end surface 94 forming the second end 88 of the cylindrical wall 80.

Referring now to FIGS. 2 through 5, the bellows shield 54 further comprises a protective barrier 150 formed on a plurality of exposed surfaces 110 of the bellows shield 54. In an embodiment of the present invention, the plurality of exposed surfaces 110 can comprise the end surface 94 of the cylindrical wall 80, the outer surface 84 of the cylindrical wall 80, and the exterior surface 98 of the attachment flange 90 contiguous with the outer surface 84 of the cylindrical wall 80. Alternately, the exposed surfaces 110 can further comprise all of the surfaces remaining on the bellows shield 54.

In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $DyO_3$.

In an embodiment of the present invention, the protective barrier 150 formed on bellows shield 54 comprises a minimum thickness, wherein the minimum thickness can be specified as constant across at least one of the plurality of exposed surfaces 110. In another embodiment, the minimum thickness can be variable across at least one of the plurality of exposed surfaces 110. Alternately, the minimum thickness can be constant over a first portion of at least one of the plurality of exposed surfaces 110 and variable over a second portion of at least one of the plurality of exposed surfaces 110 (i.e., a variable thickness can occur on a curved surface, on a corner, or in a hole). For example, the minimum thickness can range from 0.5 micron to 500 micron. Desirably, the minimum thickness ranges from 100 micron to 200 micron; and, preferably, the minimum thickness is at least 20 micron.

Figure 6:
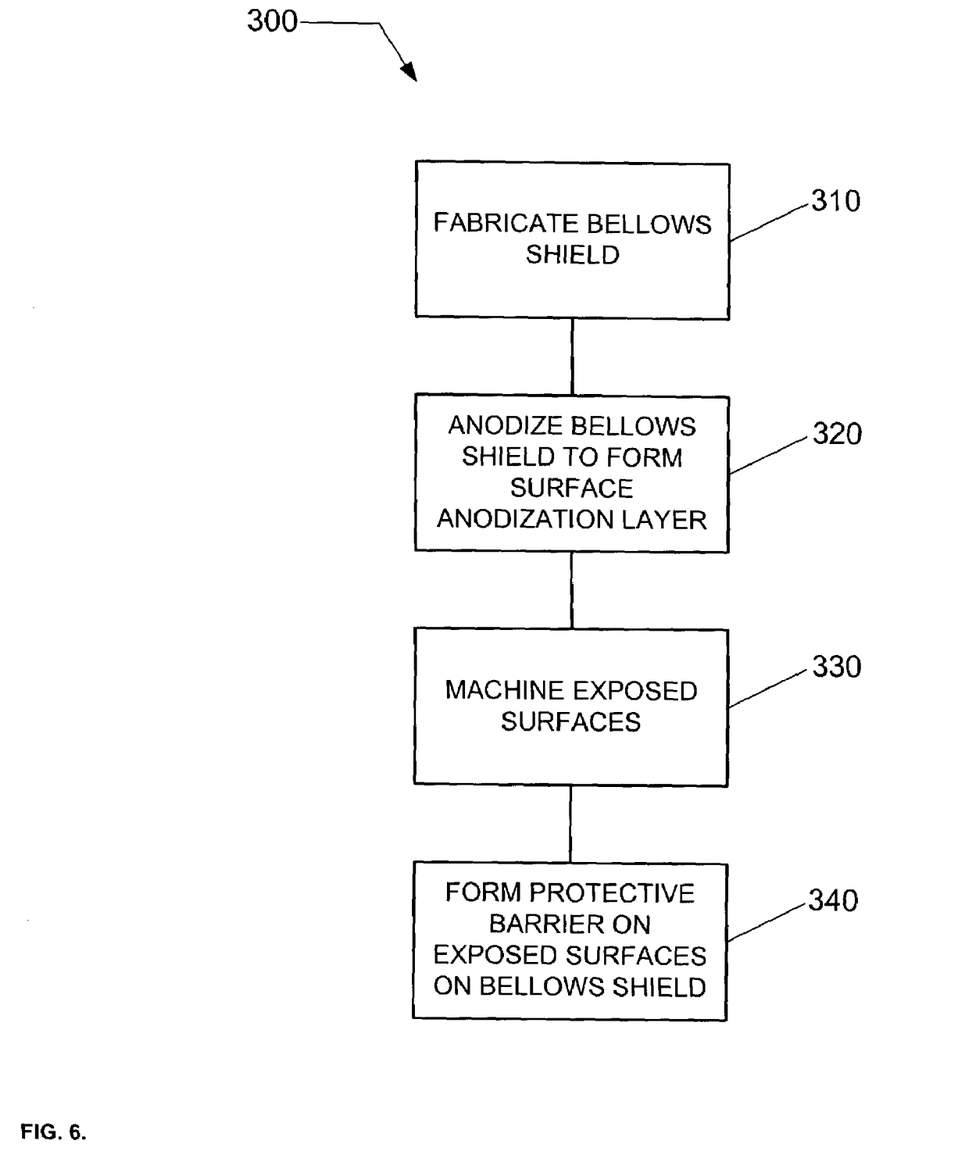
FIG. 6 presents a method of producing a bellows shield for the plasma processing system according to an embodiment of the present invention.

FIG. 6 presents a method of producing the bellows shield in the plasma processing system described in FIG. 1 according to an embodiment of the present invention. A flow diagram 300 begins in 310 with fabricating the bellows shield 54 (as described above). Fabricating the bellows shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The bellows shield 54 can, for example, be fabricated from aluminum.

In 320, the bellows shield is anodized to form a surface anodization layer. For example, when fabricating the bellows shield from aluminum, the surface anodization layer comprises aluminum oxide ($Al_2O_3$). Methods of anodizing aluminum components are well known to those skilled in the art of surface anodization.

In 330, the surface anodization layer is removed from the exposed surfaces 110 using standard machining techniques. In this step, or in a separate step, additional non-exposed surfaces (e.g., a mating surface of an interior surface of the attachment flange and an inner receptor surface of the plurality of fastening receptors) may also be machined. Such non-exposed surfaces may be machined in order to provide better mechanical or electrical contacts between those parts and the parts with which they are mated.

In 340, the protective barrier 150 is formed on the exposed surfaces 110. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 7:
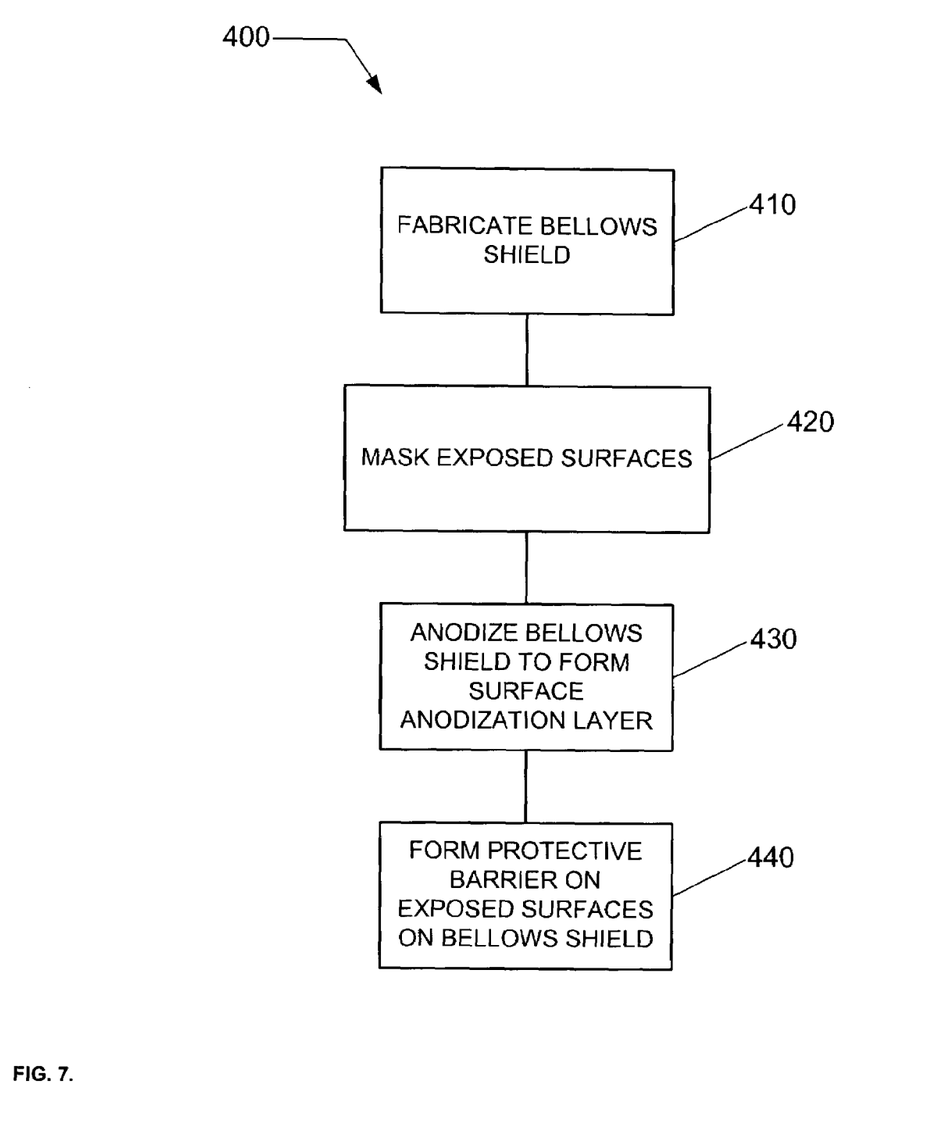
FIG. 7 presents a method of producing a bellows shield for the plasma processing system according to another embodiment of the present invention.

FIG. 7 presents a method of producing the bellows shield in the plasma processing system described in FIG. 1 according to another embodiment of the present invention. A flow diagram 400 begins in 410 with fabricating the bellows shield 54 (as described above). Fabricating the bellows shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The bellows shield 54 can, for example, be fabricated from aluminum.

In 420, the exposed surfaces 110 are masked to prevent the formation of a surface anodization layer thereon. In this step, or in a separate step, additional non-exposed surfaces (e.g., an interior surface of the attachment flange and an inner receptor surface of the plurality of fastening receptors) may be masked. Such non-exposed surfaces may be masked in order to provide better mechanical or electrical contacts between those parts and the parts with which they are mated. Techniques for surface masking and unmasking are well known to those skilled in the art of surface coatings and surface anodization.

In 430, the bellows shield is anodized to form a surface anodization layer on the remaining unmasked surfaces. For example, when fabricating the bellows shield from aluminum, the surface anodization layer can comprise aluminum oxide ($Al_2O_3$). Methods of anodizing aluminum components are well known to those skilled in the art of surface anodization.

In 440, the protective barrier 150 is formed on the exposed surfaces 110. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

Figure 8:
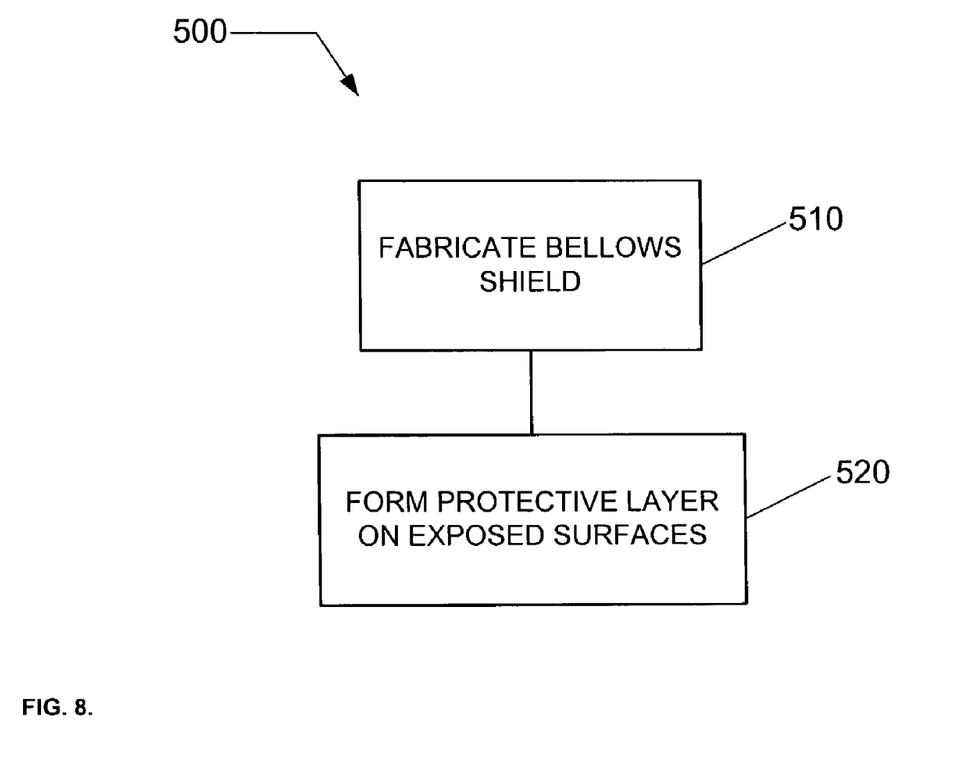
FIG. 8 presents a method of producing a bellows shield for the plasma processing system according to another embodiment of the present invention.

FIG. 8 presents a method of producing the bellows shield in the plasma processing system described in FIG. 1 according to another embodiment of the present invention. A flow diagram 500 begins in 510 with fabricating the bellows shield 54 (as described above). Fabricating the bellows shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The bellows shield pan, for example, be fabricated from aluminum.

In 520, a protective barrier is formed on the exposed surfaces 110 of the bellows shield. A protective barrier comprising, for example Yttria, can be formed using (thermal) spray coating techniques that are well known to those skilled in the art of ceramic spray coatings. In an alternate embodiment, forming the protective barrier can further comprise polishing (or smoothing) the thermal spray coating. For example, polishing the thermal spray coating can comprise the application of sand paper to the sprayed surfaces.

The processes of forming a protective barrier 150 on the exposed surfaces 110, described with reference to FIGS. 6–8 can be modified to utilize a combination of machining and masking. In such a modified process, at least one exposed surface 110 is masked to prevent formation of the anodization layer thereon while other exposed surfaces 110 are anodized. The exposed surfaces 110 that are unmasked are then machined, and the exposed surfaces that were masked are unmasked. The protective barrier 150 can then be formed on all the exposed surfaces 110. As described above, additional surfaces that are not exposed surfaces may also be machined during the method (e.g., in order to provide a better mechanical or electrical contact than we be formed with the anodization layer thereon.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A bellows shield for protecting a bellows on a substrate holder of a plasma processing system, comprising:
   a cylindrical wall comprising an inner surface, an outer surface, a first end, and a second end;
   wherein said first end comprises an attachment flange, said attachment flange comprising:
     an interior surface having a first surface extending radially inward from said inner surface of said cylindrical wall, and a mating surface extending radially inward from said first surface and axially recessed from said first surface, said mating surface being configured to mate with said substrate holder and having a groove therein further axially recessed from the mating surface and extending circumferentially around the mating surface, the groove being adjacent to the first surface
     an inner radial surface coupled to said mating surface
     an exterior surface coupled to said outer surface and said inner radial surface, said exterior surface comprising:
       a first exterior surface extending radially inward from said outer surface of said cylindrical wall,
       a second exterior surface axially protruded from said first exterior surface and extending radially inward from said first exterior surface, and
       a sidewall connecting said first exterior surface to said second exterior surface,
   wherein said attachment flange further comprises a plurality of fastening receptors coupled to said interior surface and said second exterior surface of said attachment flange and configured to receive fastening devices in order to couple said bellows shield to said substrate holder; and
   wherein said second end of said cylindrical wall comprises an end surface; and
   a protective barrier provided on a plurality of exposed surfaces of said bellows shield, wherein said exposed surfaces comprise said end surface of said second end, said outer surface of said cylindrical wall, and said exterior surface of said attachment flange of said first end, and said protective barrier is a coating which comprises Yttria, and wherein at least a portion of said inner surface includes an anodization layer thereon and does not include said protective barrier thereon, and wherein at least a portion of said mating surface does not include an anodization layer thereon and does not include said protective barrier thereon.

2. The bellows shield as recited in claim 1, wherein each of said plurality of fastening receptors comprises an entrant cavity opening to said second exterior surface, an exit through-hole opening to said interior surface, and an inner receptor surface provided within said fastening receptor.

3. The bellows shield as recited in claim 2, wherein said entrant cavity comprises:
a first entrant cavity opening to said second exterior surface; and
a second entrant cavity coupling said first entrant cavity to said exit through hole, wherein said second entrant cavity is wider than said exit through hole, and said first entrant cavity is wider than said second entrant cavity.

4. The bellows shield as recited in claim 3, wherein said protective barrier is not provided on said first entrant cavity, not provided on said second entrant cavity and not provided on said exit through-hole.

5. The bellows shield as recited in claim 2, wherein said protective baffler is not provided on at least a portion said inner receptor surface.

6. The bellows shield as recited in claim 2, wherein said protective barrier is a spray coating and said entrant cavity comprises:
a first entrant cavity opening to said second exterior surface; and
a second entrant cavity coupling said first entrant cavity to said exit through hole, wherein said second entrant cavity is wider than said exit through hole, and said first entrant cavity is wider than said second entrant cavity.

7. The bellows shield as recited in claim 1, wherein said bellows shield is formed of a metal.

8. The bellows shield as recited in claim 7, wherein said metal comprises aluminum.

9. The bellows shield as recited in claim 1, wherein said protective barrier is provided in direct contact with a bare surface of said bellows shield not having an anodization layer thereon.

10. The bellows shield as recited in claim 1, wherein said protective barrier is provided only in direct contact with a bare surface of said bellows shield not having an anodization layer thereon.

11. The bellows shield as recited in claim 1, wherein said protective barrier comprises a thermal spray coating having a minimum thickness and said minimum thickness is constant across at least one of said exposed surfaces.

12. The bellows shield as recited in claim 1, wherein said protective barrier comprises a thermal spray coating having a minimum thickness and said minimum thickness is variable across at least one of said exposed surfaces.

13. The bellows shield as recited in claim 1, wherein said cylindrical wall has a minimum thickness of at least two millimeters.

14. The bellows shield as recited in claim 1, wherein said inner radial surface comprises a minimum diameter of at least 200 millimeters.

15. The bellows shield as recited in claim 1 wherein said outer surface of the cylindrical wall is a bare surface not having an anodization layer provided thereon, and said protective barrier is provided in direct contact with said bare surface.

16. The bellows shield as recited in claim 1, wherein said mating surface comprises:
a first mating surface coupled to said inner radial surface; and a second mating surface coupled to said first mating surface and said first surface of the interior surface, said second mating surface being axially recessed from said first mating surface and said first surface of the interior surface to form a portion of said groove.

17. The bellows shield as recited in claim 1, wherein:
said protective barrier is not provided on said inner surface, is not provided on said first surface of the interior surface, is not provided on said second mating surface and is not provided on said first mating surface; and
an anodization layer is provided on said inner surface, said first surface of the interior surface and said second mating surface.

18. The bellows shield as recited in claim 17, wherein said first mating surface is a bare metal surface not having said protective barrier provided thereon and not having said anodization layer provided thereon.

19. The bellows shield as recited in claim 1, wherein said protective barrier is not provided on said inner surface and is not provided on any portion of said interior surface.

20. The bellows shield as recited in claim 19, wherein said inner surface and said first surface of the interior surface each include an anodization layer provided thereon; and
wherein said mating surface is a bare metal surface not having said protective barrier provided thereon and not having said anodization layer provided thereon.

21. The bellows shield as recited in claim 1, wherein said protective baffler is not provided on any portion of said inner receptor surface.

22. The bellows shield as recited in claim 1, wherein said first exterior surface, said second exterior surface and said sidewall form a shoulder structure configured to receive a shield ring,
wherein said exterior surface is a bare metal surface having said protective barrier in direct contact therewith.

23. The bellows shield as recited in claim 22, wherein said exterior surface further comprises:
a rounded transition region coupling said outer surface to said first exterior surface;
a rounded transition region coupling said first exterior surface to said sidewall; and
a rounded transition region coupling said sidewall to said second exterior surface.

24. The bellows shield as recited in claim 1, wherein said end surface comprises:
a first tapered transition coupling said inner surface to said end surface; and
a second tapered transition coupling said outer surface to said end surface, wherein said protective barrier is provided on said first tapered surface, provided on said end surface, provided on said second tapered surface and provided on said outer surface.

25. The bellows shield as recited in claim 24, wherein each of said first tapered transition, said end surface, said second tapered transition and said outer surface are bare surfaces not having an anodization layer thereon.

26. The bellows shield as recited in claim 1 wherein said protective barrier is a spray coating.

27. The bellows shield as recited in claim 26, wherein said mating surface comprises:
   a first mating surface coupled to said inner radial surface;
   a second mating surface coupled to said first mating surface and said first surface of the interior surface, said second mating surface being axially recessed from said first mating surface and said first surface of the interior surface.

28. The bellows shield as recited in claim 1, wherein said inner radial surface does not have said protective barrier thereon.

29. The bellows shield as recited in claim 28, wherein said inner radial surface has an anodization layer provided thereon.

30. The bellows shield as recited in claim 1, wherein each of said end surface of the second end, said outer surface of the cylindrical wall and said exterior surface of the attachment flange is a bare surface not having an anodization layer thereon.

* * * * *

UNITED STATES PATENT AND TRADEMARK OFFICE
CERTIFICATE OF CORRECTION

| | |
|---|---|
| PATENT NO. | : 7,204,912 B2 |
| APPLICATION NO. | : 10/259306 |
| DATED | : April 17, 2007 |
| INVENTOR(S) | : Hidehito Saigusa et al. |

It is certified that error appears in the above-identified patent and that said Letters Patent is hereby corrected as shown below:

Change in Column 6, line 19, "$DyO_3$" to --$Dy_2O_3$--.

Signed and Sealed this

Ninth Day of October, 2007

JON W. DUDAS
*Director of the United States Patent and Trademark Office*